(12) United States Patent
Heau et al.

(10) Patent No.: US 11,236,861 B2
(45) Date of Patent: Feb. 1, 2022

(54) FRICTION PIECE, MECHANICAL SYSTEM COMPRISING SUCH A FRICTION PIECE AND METHOD OF IMPLEMENTATION

(71) Applicant: H.E.F., Andrezieux-Boutheon (FR)

(72) Inventors: Christophe Heau, Saint Etienne (FR); Philippe Maurin-Perrier, Saint Marcellin en Forez (FR)

(73) Assignee: H.E.F., Andrezieux-Boutheon (FR)

( * ) Notice: Subject to any disclaimer, the term of this patent is extended or adjusted under 35 U.S.C. 154(b) by 0 days.

(21) Appl. No.: 16/467,636

(22) PCT Filed: Dec. 4, 2017

(86) PCT No.: PCT/FR2017/053377
§ 371 (c)(1),
(2) Date: Jun. 7, 2019

(87) PCT Pub. No.: WO2018/104641
PCT Pub. Date: Jun. 14, 2018

(65) Prior Publication Data
US 2020/0080686 A1    Mar. 12, 2020

(30) Foreign Application Priority Data
Dec. 7, 2016 (FR) ...................................... 1662033

(51) Int. Cl.
*F16N 17/02* (2006.01)
*F16N 1/00* (2006.01)
(Continued)

(52) U.S. Cl.
CPC ............ *F16N 1/00* (2013.01); *C23C 14/0605* (2013.01); *C23C 14/0635* (2013.01);
(Continued)

(58) Field of Classification Search
CPC ............ C23C 14/0605; C23C 14/0635; C23C 14/0641; C23C 14/0036; C23C 30/005;
(Continued)

(56) References Cited

U.S. PATENT DOCUMENTS 5,618,590 A * 4/1997 Naruse ................ C23C 14/0688
204/192.16
2015/0018254 A1 1/2015 Araujo et al.

FOREIGN PATENT DOCUMENTS

FR    2594143    8/1987

OTHER PUBLICATIONS

"Tribological behavior of W-C-Co coatings", Viera et al., Journal of Materials Processing Technology, 31 (1992), pp. 225-234 (Viera) (Year: 1992).*

(Continued)

*Primary Examiner* — Daniel J. Schleis
*Assistant Examiner* — Kevin C T Li
(74) *Attorney, Agent, or Firm* — Meunier Carlin & Curfman LLC

(57) ABSTRACT

The present invention concerns a friction piece (10) suitable for operating in a lubricated medium at a temperature higher than 200° C. The piece (10) comprises a metal surface (12) and an external coating (14) composed of tungsten carbide doped with nitrogen WC(N) with an atomic ratio of nitrogen between 5 and 12%. The invention also relates to a mechanical system (1) comprising such a piece (10). The invention also relates to a method for implementing such a piece (10).

9 Claims, 4 Drawing Sheets

(51) Int. Cl.
| | |
|---|---|
| *C23C 14/00* | (2006.01) |
| *C23C 14/06* | (2006.01) |
| *F16J 15/16* | (2006.01) |
| *C10M 135/00* | (2006.01) |
| *C23C 30/00* | (2006.01) |
| *C10M 103/06* | (2006.01) |

(52) U.S. Cl.
CPC ........ *C23C 14/0641* (2013.01); *C23C 30/005* (2013.01); *F16J 15/16* (2013.01); *F16N 17/02* (2013.01)

(58) Field of Classification Search
CPC .. C23C 30/00; F16N 1/00; F16N 17/02; F16J 15/16; F16C 2223/60; C10M 2201/061; C10M 135/00; C10M 103/06; C10N 2040/25; C10N 2080/00; C10N 2040/04
See application file for complete search history.

(56) References Cited

OTHER PUBLICATIONS

"Relatively low temperature synthesis of hexagonal tungsten carbide films by N doping and its effect on the preferred orientation, phase transition, and mechanical properties", Su et al., Journal of Vacuum Science & Technology A Vacuum Surfaces and Films, Mar. 2009 (Su) (Year: 2009).*

"Metal-carbon layers for industrial application in the automotive industry", Guttler et al., Surface and Coatings Technology, 60 (1993), pp. 531-535 (Guttler) (Year: 1993).*

International Search Report (English) and Written Opinion dated Feb. 7, 2018, from International Application No. PCT/FR2017/053377, 14 pages.

Liu, Y. et al. "Evaluation of the friction of WC/DLC solid lubricating films in vacuum", ScienceDirect, Tribology International 39 (2006) 1584-1590.

* cited by examiner

FRICTION PIECE, MECHANICAL SYSTEM COMPRISING SUCH A FRICTION PIECE AND METHOD OF IMPLEMENTATION

The present invention concerns a friction piece that can be subjected to high temperatures in a lubricated medium. The invention also concerns a mechanical system comprising such a piece. The device also relates to a method for implementing such a piece.

The field of the invention is that of metal friction pieces coated with a thin layer, enabling a reduction in friction in a lubricated medium.

By way of a non-limiting example, the friction piece can be an automobile engine segment, especially the combustion chamber. In practice, the segments are subjected to operating temperatures above 200° C., in a lubricated medium that can be depleted.

According to other non-limiting examples, the thin film coating may be applied to a piston pin, a piston skirt, any other part of the piston, or any other part which may be subjected to high-temperature operation.

In industrial applications, the presence of a lubricating film separating two friction pieces makes it possible to obtain low levels of wear, by virtue of the total absence of contact between these two pieces.

In some cases, a continuous film cannot be maintained over time, which causes direct interaction between the two pieces. The discontinuity of the lubricating film is the main feature of the lubrication in a "mixed regime" and a "boundary regime".

In the automotive industry, DLC ("Diamond-Like Carbon") thin layer coatings are widely used in order to reduce friction between parts. In practice, the reduction of friction between DLC-coated parts operates primarily with the mixed lubrication regime.

An essential feature of DLC coatings is that the roughness of the surface decreases over time and tends towards particularly low values. Thus, the transition of the lubrication from the boundary regime to the mixed regime, or from the mixed regime to the hydrodynamic regime, shifts to lower speed values.

Unlike DLC-coated surfaces, initially polished steel surfaces experience an increase in the roughness thereof over time. By reacting on the surfaces, ZDTP-type anti-wear additives form islands, locally increasing the roughness.

Some lubricated contacts permanently operate at temperatures above 200° C., and transiently at even higher temperatures. These contacts are poorly lubricated, which also explains the high temperatures that prevail there.

Under such operating conditions, the wear of a DLC coating is relatively rapid. Stochastic behavior is observed with this wear, probably due to the fact that the lubrication is relatively reduced and poorly controlled.

The DLC coating then exhibits wear by polishing and the coating layer is consumed, according to a mechanism which is similar to oxidation. The carbon and hydrogen of the coating layer combine with ambient oxygen to form water and carbon dioxide. The depletion of the lubricant and the temperature rise at the contact interface between the friction parts leads to accelerated oxidation of the DLC coating, until the disappearance thereof. The poorly controlled nature of the lubrication, combined with high temperatures, thus leads to an increase in the rate of wear.

Today, two approaches make it possible to address the above problems.

The first approach is to use chromium alloy coatings comprising chromium nitrides, which have high strength under high temperature operating conditions and poor lubrication, at the expense of a reduction in friction. This approach corresponds to old designs of mechanical systems, such as the combustion chambers of an automotive engine, commonly coated with chromium-based layers. This approach does not make it possible to lower friction losses compared to an uncoated steel, but nonetheless protects the surfaces against wear and scoring.

The second approach would be to improve the lubrication associated with a DLC coating, allowing for better heat dissipation and protection with respect to oxygen. This approach would make it necessary to change the design of mechanical systems in order to distribute the lubricant in such a way as to increase the flow rates of the lubricant, and therefore the energy used to ensure the circulation of said lubricant. In practice, this second approach is not implemented due to the additional design costs, and the fact that the energy efficiency provided by the coating would be offset by the efforts necessary in order to have abundant lubrication.

The purpose of the present invention is to propose an improved friction piece, remedying the aforementioned disadvantages.

To this end, the invention relates to a friction piece having a metal surface and an outer coating layer, characterized in that the outer coating layer is composed of tungsten carbide doped with nitrogen WC(N) with an atomic ratio of nitrogen between 5 and 12%.

Thus, the invention makes it possible to reduce the friction to which a coating layer is subjected in a lubricated medium, particularly in a mixed lubrication regime, whilst improving the resistance thereof to high load temperatures, especially above 200° C.

Compared with a DLC coating, the coating materials of the invention are much more resistant to wear when hot, due to the better thermal stability and oxidation resistance thereof, whilst providing a satisfactory reduction in friction.

In comparison with a coating of chromium nitride CrN or tungsten carbide WC (with 6% Co by weight), coating materials of the tungsten carbide type doped with nitrogen WC(N) according to the invention make it possible to reduce friction, whilst providing satisfactory resistance to oxidation.

Other advantageous characteristics of the invention, taken separately or in combination, are detailed below.

Preferably, the outer coating layer comprises at least one element selected from cobalt, nickel and iron for a total atomic ratio between 5 and 11%. The additive element may be pure, and have an atomic ratio between 5 and 11% within the coating layer. Alternatively, more additive elements may form a mixture, for a total atomic ratio between 5 and 11% within the coating layer.

According to a preferred embodiment, the coating layer comprises:
- an atomic ratio of carbon between 40 and 43%,
- an atomic ratio of tungsten between 40 and 43%,
- an atomic ratio of nitrogen between 5 and 12%,
- at least one element chosen from cobalt, nickel and iron for a total atomic ratio between 5 and 12%,
- other compounds for a total atomic ratio between 0 and 10%.

According to a preferred embodiment, the outer coating layer is made of tungsten carbide doped with nitrogen WC(N), with:
- an atomic ratio of carbon between 40 and 43%,
- an atomic ratio of tungsten between 40 and 43%,
- an atomic ratio of cobalt between 7 and 9%, an atomic ratio of nitrogen between 5 and 12%,
other compounds for a total atomic ratio between 0 and 8%.

In practice, the outer coating layer is formed by means of the vacuum sputtering of a target of tungsten carbide WC, with the introduction of a flow of nitrogen.

The cobalt, nickel and/or iron is an element of the target.

Conventionally, the manufacture of the friction piece includes a step of etching the metal surface to be coated, in particular an ion etching before depositing the outer coating layer.

According to a particular embodiment, the metal surface is coated with only the outer coating layer, excluding the presence of a sub-layer between the metal surface and the outer coating layer.

Alternatively, the metal surface is coated with at least one sub-layer formed beneath the outer coating layer. This sub-layer is for example composed of chromium or chromium nitride.

The invention also relates to a mechanical system comprising a first friction piece as mentioned above, a second friction piece arranged in lubricated contact with the first friction piece, and a lubricant arranged at a lubricated contact interface between the friction pieces.

According to a particular embodiment, the second friction piece is similar to the first friction piece. In other words, the second friction piece comprises a metal surface and an outer coating layer deposited upon the metal surface, the outer coating layer of the second friction piece being composed of tungsten carbide doped with nitrogen WC(N) with an atomic ratio of nitrogen between 5 and 12%.

Preferably, the outer coating layer of the first friction piece and the outer coating layer of the second friction piece have the same composition.

Alternatively, the coating layers compared may have different compositions, nonetheless with an atomic ration of nitrogen between 5 to 12%.

The invention also relates to a method for implementing a friction piece like that mentioned above. The method is characterized in that it comprises the following steps:
arranging a second friction piece in lubricated contact with the friction piece;
arranging a lubricant in a lubricated contact interface between the friction pieces; and
actuating the friction parts, in such a way that the lubricated contact interface between the friction parts reaches a temperature higher than 200° C.

The invention will be better understood upon reading the following description, given solely as a non-limiting example, and made with reference to the accompanying figures wherein.

Figure 1:
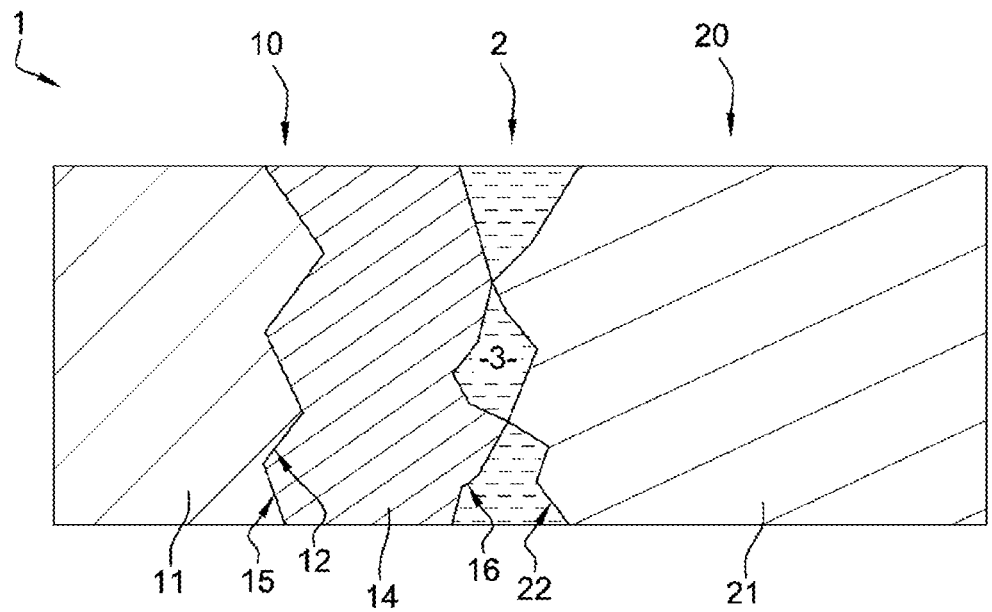
FIG. 1 is a partial schematic view of a mechanical system according to the invention in cross-section.

In FIG. 1, a mechanical system 1 according to the invention is shown, partially and schematically.

The mechanical system 1 comprises two friction pieces 10 and 20 separated by a lubricant 3 at the contact interface 2 thereof. In practice, the interface 2 is subjected to operating temperatures higher than 200° C. Under these conditions, the lubricant 3 is susceptible to being depleted.

The pieces 10 and 20 are given a relative movement in translation and/or rotation. For the purpose of simplification, the pieces 10 and 20 may have any shape and arrangement suitable for the intended application, i.e., suitable for the type of mechanical system 1. The pieces 10 and 20 are made of metal, preferably steel.

The piece 10 comprises a body 11, an outer surface 12, and an outer coating layer 14 deposited upon the surface 12. The layer 14 has an upper surface 15 and a lower surface 16. The surface 15 is secured to the metal surface 12 during the deposition of the layer 14. The surface 16 faces the piece 20 at the lubricated contact interface 2.

The piece 20 comprises a body 21 and an outer surface 22. The piece is without an outer coating layer. The surface 20 faces the piece 10 at the lubricated contact interface 2.

In a boundary or mixed regime, the surface 16 of the coating layer 14 and the surface 22 of the piece 20 are in contact at locations, at the lubricated contact interface 2 between the pieces 10 and 20. Thus, the lubricant 3 forms a discontinuous film between the surfaces 16 and 22, at the interface 2.

The lubricant 3 is chosen as a function of the envisaged application, in other words as a function of the type of mechanical system 1. For example, the lubricant 3 can be a commercial automotive lubricant, such as a SAE 5W30 oil comprising conventional additives.

According to the invention, the coating layer 14 is a compound of the tungsten carbide type doped with nitrogen WC(N), with an atomic ratio of nitrogen between 5 and 12%, inclusive.

In practice, such a coating layer 14 is well adapted to operating within a lubricated medium at temperatures higher than 200° C. Thus, the piece 10 comprising the coating layer 14 is suitable for operating in a lubricated medium at temperatures higher than 200° C.

Unexpectedly, the doping of tungsten carbide layers with nitrogen leads to a reduction in friction in a lubricated medium, compared to conventional materials wherein the tungsten carbide WC is undoped or lightly doped (atomic ratio of nitrogen of less than 5%).

Figure 2:
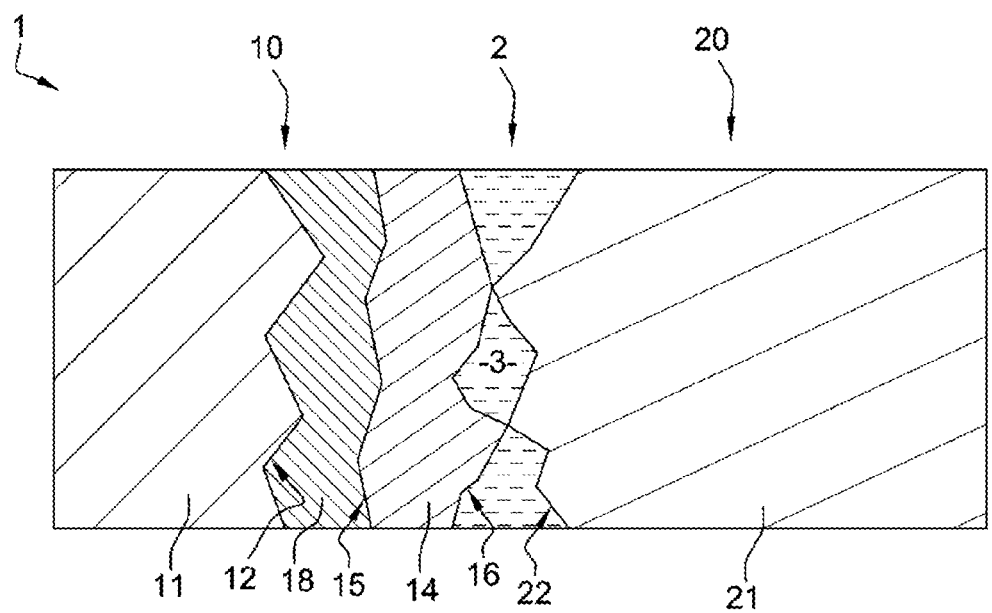
FIG. 2 is a similar view to FIG. 1, showing a mechanical system according to a second embodiment of the invention.
Figure 3:
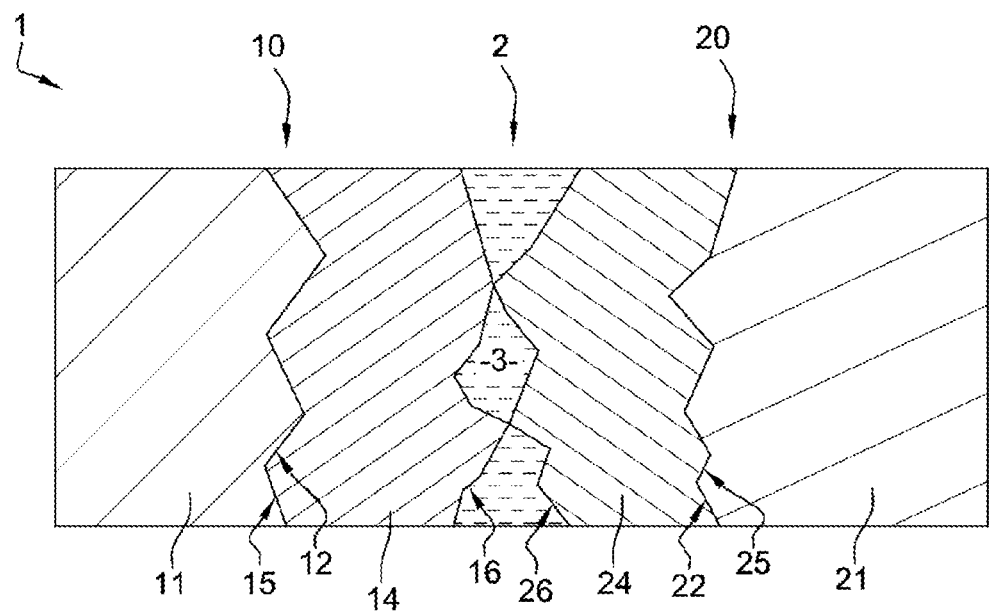
FIG. 3 is a similar view to FIG. 1, showing a mechanical system according to a third embodiment of the invention.

In FIGS. 2 and 3 there are shown partially and schematically, mechanical systems 1 in according to other embodiments of the invention. The components of the system 1 that are similar to the first embodiment bear the same numerical references. Only those differences in comparison to the first embodiment are detailed below.

In FIG. 2, the piece 10 comprises a sub-layer 18 formed between the body 11 and the coating layer 14. The surface 12 is coated with the sub-layer 18, and then with the coating layer 14. By way of non-limiting examples, the sub-layer may be composed of chromium or chromium nitride. The chromium nitride can be deposited by means of reactive magnetron sputtering.

In FIG. 3, the piece 20 comprises an outer coating layer 24 deposited onto the surface 22. The layer 24 has an inner surface 25 and an outer surface 26. The surface 25 is secured to the metal surface 22 during the deposition of the layer 24. The surface 26 faces the piece 10 at the lubricated contact interface 2. The lubricant 3 forms a discontinuous film between the surfaces 16 and 26 of the coating layers 14 and 24, at the lubricated contact interface between the two pieces 10 and 20.

According to a particular embodiment, the piece 20 is also according to the invention. In other words, the outer coating layer 24 has a composition of the nitrogen doped tungsten carbide WC(N) type with an atomic percentage of nitrogen between 5 and 12. In this particular case, where the two surfaces 12 and 22 of the pieces 10 and 20 are coated, the layers 14 and 24 preferably have a similar composition.

Alternatively, the piece 20 may comprise an outer coating layer 24 having a different composition from that of the layer 14.

Furthermore, the piece 20 may comprise a sub-layer formed between the body 21 and the coating layer 24, as described above for the piece 10 with reference to FIG. 2.

The identification method for those coating materials that are capable of withstanding conditions of lubrication and high temperature is detailed below.

This method consists in depositing a coating layer upon steel specimens, and then characterizing the different coatings on the one hand by friction within a lubricant and, on the other hand, resistance to a temperature of 350° C.

The coating materials tested are: chromium nitride CrN, tungsten carbide WC, tungsten carbides doped with nitrogen WC(N), a-C:H-type DLC.

Prior to depositing the coating, all of the test pieces undergo the same preparation steps. The test pieces are degreased and positioned upon a rotating sample holder with a planetary movement, according to the state of the art vacuum deposition of hard thin films. Pumping of the vacuum chamber is then performed. The pumping is performed in conjunction with heating to 150° C., which makes it possible to activate the desorption phenomena and to improve the quality of the vacuum. After 2 hours 30 minutes of heating, it is ensured that the pressure measured using a Penning gauge is less than $2 \times 10^{-5}$ mbar. Ion etching of the steel test pieces is then performed in an argon plasma for one hour with a voltage of −150 V applied to the specimens. After the etching, the passivation oxide of the test pieces disappears and the surfaces are suitable for receiving a deposit.

The chromium nitride deposition is performed by reactive magnetron sputtering. During the end of the ion etching of the test piece, the magnetron cathode is excited at a power of five kilowatts, behind a pre-sputtering cover in order to clean the surface thereof for 5 minutes. At the end of the etching, the ion-assisted plasma is maintained, the bias voltage is lowered to −50 V and the cover is opened in such a way that a thin chromium layer begins to be deposited. During the deposition of this layer, the intensity emitted by the chromium atoms in the plasma is measured at a wavelength of 520 nm. This light intensity is normalized to 100 and a flow of nitrogen is introduced until the light emitted by the chromium decreases to a value of 50% of the intensity emitted in pure argon. Over 3 hours of deposition, a layer of CrN is thus obtained with a thickness of 2.7 μm and a hardness of 1900 Hv under 10 mN.

The tungsten carbide deposit is formed by sputtering a target of tungsten carbide with 6% by mass of a cobalt binder. The target is cleaned under cover for 5 minutes at the end of the ion etching. Once the ion etching is completed, the plasma ion assistance is turned off and the pre-sputtering cover is opened in order to start the deposition of the WC. After 3 hours of deposition, a layer is obtained with a thickness of 2.1 μm and a hardness of 1900 Hv under 10 mN.

The nitrogen-doped tungsten carbide deposits are produced by introducing a reactive gas flow within the sputtered flux.

Irrespective of the nitrogen flow rate from 60 sccm of nitrogen, the composition of the coating layer is stable and EDX analyses indicate a composition comprising 40% carbon, 12% nitrogen, 8% cobalt and 40% tungsten. Under these conditions, the nitrogen-doped deposits have a hardness of 2900 Hv, significantly higher than that of a WC deposit without reactive gas.

The characteristics of the deposits are summarized in Table 1 below. The deposits recorded from WC0 to WC4 are made with an increasing flow of nitrogen up to saturation of the nitrogen (60 sccm in the particular case of the deposition conditions used here).

TABLE 1 tungsten carbide deposits doped with nitrogen

| Reference | % at N | % at Co | % at W | % at C | Hv in kg · mm$^{-2}$ | E' in GPa | Compliance |
|---|---|---|---|---|---|---|---|
| WC0 | 0 | 10 | 45 | 45 | 2200 | 270 | NC |
| WC1 | 2 | 10 | 44 | 44 | 2400 | 290 | NC |
| WC2 | 5 | 9 | 43 | 43 | 2850 | 305 | C |
| WC3 | 9 | 9 | 41 | 41 | 2950 | 310 | C |
| WC4 | 12 | 8 | 40 | 40 | 2900 | 315 | C |

Finally, the deposition of type a-C:H DLC is performed by means of a combination of a PVD deposition technology in order to deposit a WC-based sub-layer, which is progressively enriched with carbon in order to obtain a composition thereof in order to promote the adhesion of the DLC layer prepared in PACVD as described within document WO2012/156647. The deposit thus obtained is composed of a W-based layer 0.8 μm thick, whereupon a 2.2 μm layer of DLC is deposited. The total deposit thickness is 3 μm and the surface hardness is 3200 Hv.

FIGS. 4 to 7 illustrate a first characterization test, consisting in a series of tribological tests on the test pieces.

Figure 4:
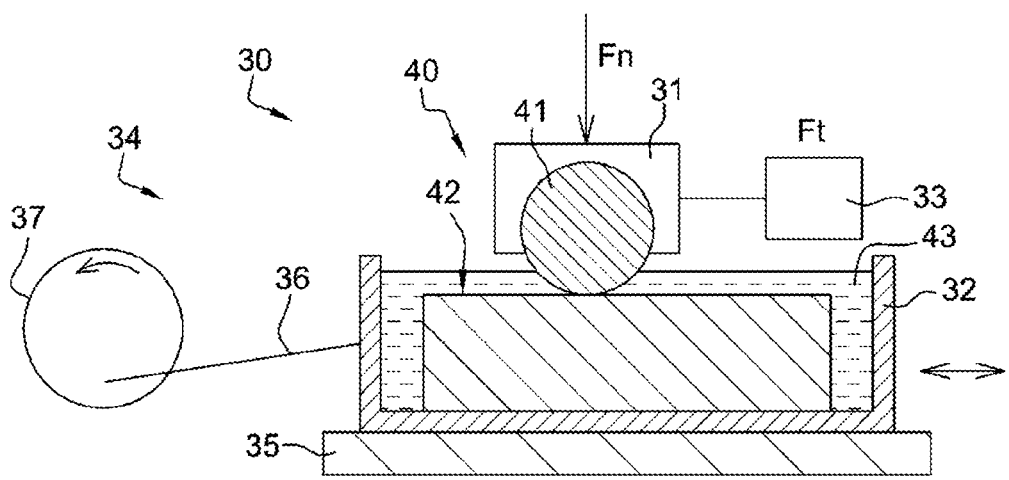
FIG. 4 is a schematic representation of a test stand used to identify the coating materials according to the invention.

FIG. 4 is a schematic representation of a test stand 30, comprising a tribometer. The aim of the series of tests is to demonstrate the potential of specific coating materials to reduce friction in a lubricated medium, in comparison with a steel/steel contact. In order to test only the effects of the coatings, it is ensured that the tests are conducted under the same conditions. In particular, all of the test pieces have an identical initial roughness.

The test stand 30 is used to characterize the friction within a mechanical system 40 consisting of two test pieces 41 and 42 made of steel, namely a cylinder 41 and a disc 42. Successive tests implement multiple systems 40, and therefore several test pieces 41 and 42. In a reference system 40, the test pieces 41 and 42 do not receive a coating, which makes it possible to characterize the steel/steel contact surface. In each of the other systems 40, the test pieces 41 and 42 receive the same coating material. The two coated test pieces 41 and 42 rubbing against one another corresponds to the configuration of FIG. 3.

The cylinders 41 used in the tests are 100Cr6 steel cylindrical rollers, from a roller bearing. The cylinders 41 have a diameter of 10 mm. The surface of the cylinders 41 is polished on at least one generatrix in order to obtain an arithmetic mean roughness Ra of <0.02 μm, then this generatrix is coated with the test material.

The discs 42 used for the tests have a diameter of 25 mm and a thickness of 5 mm. A flat surface of each disk 42 is polished to an average roughness Ra of <0.02 μm, and then coated with the test material.

In order to perform a test, the disc 42 is installed in a tank 32 filled with a commercial automotive lubricant, in this case an oil of the type 43 SAE 5W30 comprising conventional additives. This oil 43 makes it possible to obtain a coefficient of friction in the order of 0.12 to 0.13 for a steel/steel contact in a boundary lubrication regime. The disc 42 is secured within the tank 32 while being immersed in the oil 43.

The cylinder 41 is mounted on a support 31 suspended by flexible steel blades, which allow for the self-alignment of the cylinder 41 with the polished surface of the disk 42 when the test pieces 41 and 42 are brought into contact. This self-alignment system is essential to conducting the tests correctly, insofar as it ensures that the geometry of the contact between the test pieces 41 and 42 is perfectly controlled, in such a way that it does not induce bias into the friction measurement. The alignment of the test pieces 41 and 42 in a planar cylindrical contact is the main difficulty with such tests.

The support 31 of the cylinder 41 is connected to the rest of the tribometer by means of a piezoelectric sensor 33, placed facing the lubricated contact between the coated generatrix of the cylinder 41 and the coated planar surface of the disc 42. The sensor 33 makes it possible to measure the tangential force Ft, from which the friction coefficient is determined.

The lubricated contact interface between the cylinder 41 and the disc 42 is 4 mm in length along the generatrix and 35 µm in contact width in the friction direction. By applying a normal load Fn equal to 21 N, a contact pressure is obtained equal to 200 MPa. Other than the alignment of the test pieces 41 and 42, the contact pressure is an essential element in determining the friction coefficient.

From a kinematic point of view, the cylinder 41 wears more quickly than the disk 42, irrespective of the nature of the coating material. Thus, it is crucial to ensure that the cylinder 41 does not present any significant wear after the test. In effect, the wear of the cylinder 41 after the test results in a reduction in the contact pressure due to enlargement of the contact area. The reduction in friction would therefore no longer be solely in relation to the coating material, but also to the drop in contact pressure due to wear. In order to avoid this, light polishing is performed of the disk 42 coated with 1200 grade SiC abrasive paper. This polishing removes the peaks of the surface, which induces a notable reduction in the wear rate of the cylinder 41. At the end of the test, the width of the friction track is checked. The test results in a reject if the width of the track exceeds 45 µm. For all of the results shown, the width of the friction track is between 35 and 45 µm, indicating that no significant wear has taken place and therefore that the friction is due to the nature of the coating materials.

The disc 42 is movable in translation in a reciprocating linear motion, by virtue of a translation mechanism 34. In this case, the disc 42 is secured within the vessel 32, which is placed on a ball bearing rail 35 and connected by a rod 36 to an eccentric element 37 movable in rotation. The eccentric element 37 is rotated by means of a motor, not shown for purposes of simplification. This mechanism 34 makes it possible to communicate to the vessel 32, and therefore to the disk 42, a reciprocating linear motion with a 10 mm stroke, according to a sinusoidal law.

The oil 43 is heated to 110° C. within the vessel 32, then the mechanism 34 drives the drum 32 in the back and forth motion. A preliminary 1 hour test is performed with a normal load Fn of 21 N, with a speed of rotation of the eccentric element 37 of 300 rpm. This preliminary test is used to grind the surface and to stabilize the friction.

After obtaining stabilized friction, 3 minute tests are performed at speeds of rotation of the eccentric element 37 of 300, 450, 600 and 750 rpm. From these tests, the evolution of the friction coefficient depending upon the translation speed of the disc 42 is extracted.

Figure 5:
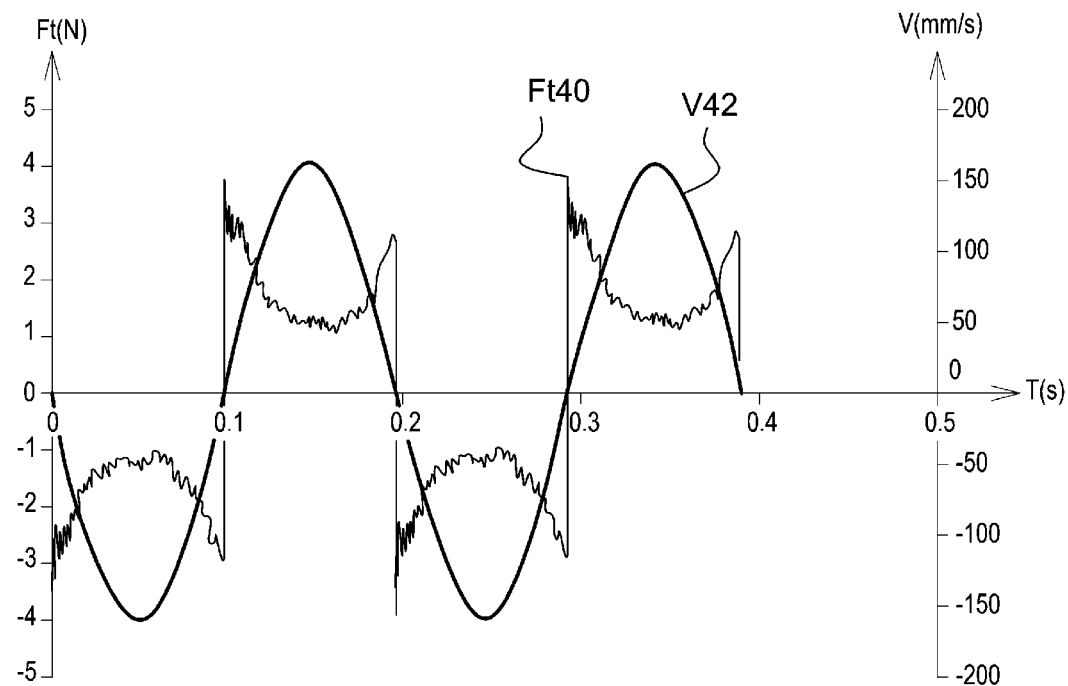
FIGS. 5, 6 and 7 are graphs illustrating different steps of identifying the coating materials according to the invention.

FIG. 5 is a graph illustrating a measurement performed with the piezoelectric sensor 33 fitted to the test bench 30, for a given coating material.

The x-axis represents the time T in seconds. The left ordinate axis represents the tangential force Ft in Newtons. The right ordinate axis represents the displacement speed V of the disk 42 mm/s.

The graph of FIG. 5 shows a sinusoidal curve V42 representing the displacement speed V of the disc 42 and a curve FT40 representing the tangential force Ft measured by the sensor 33, as a function of time T.

Figure 6:
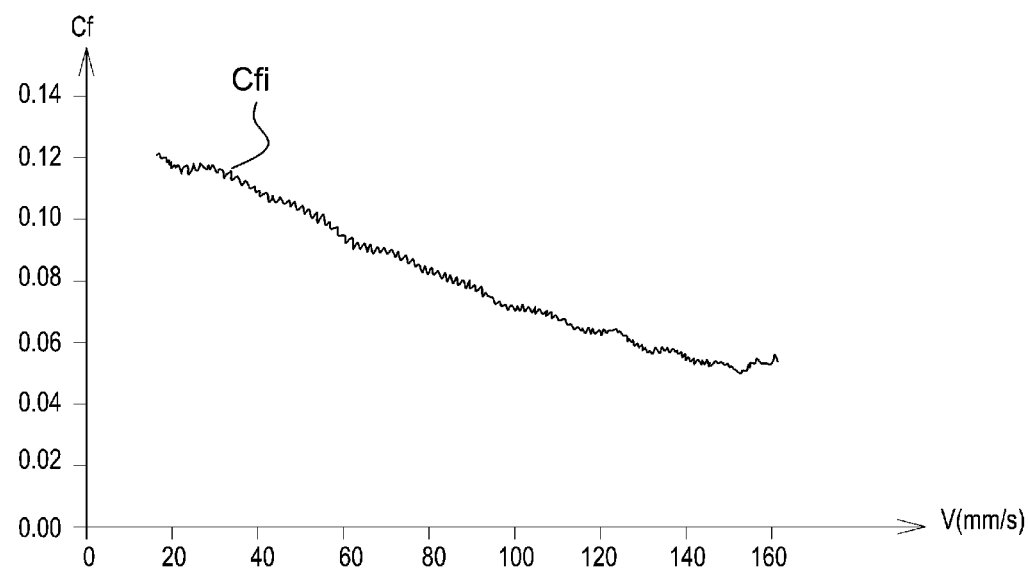

The graph of FIG. 6 shows a curve Cfi representing the evolution of the friction coefficient Cf depending upon the instant displacement speed V of the disc 42, from the measurements for a given coating material.

The x-axis represents the instantaneous speed V in mm/s obtained from the curve V42, while the y-axis represents the instantaneous coefficient of friction Cf determined from the curve FT40.

Figure 7:
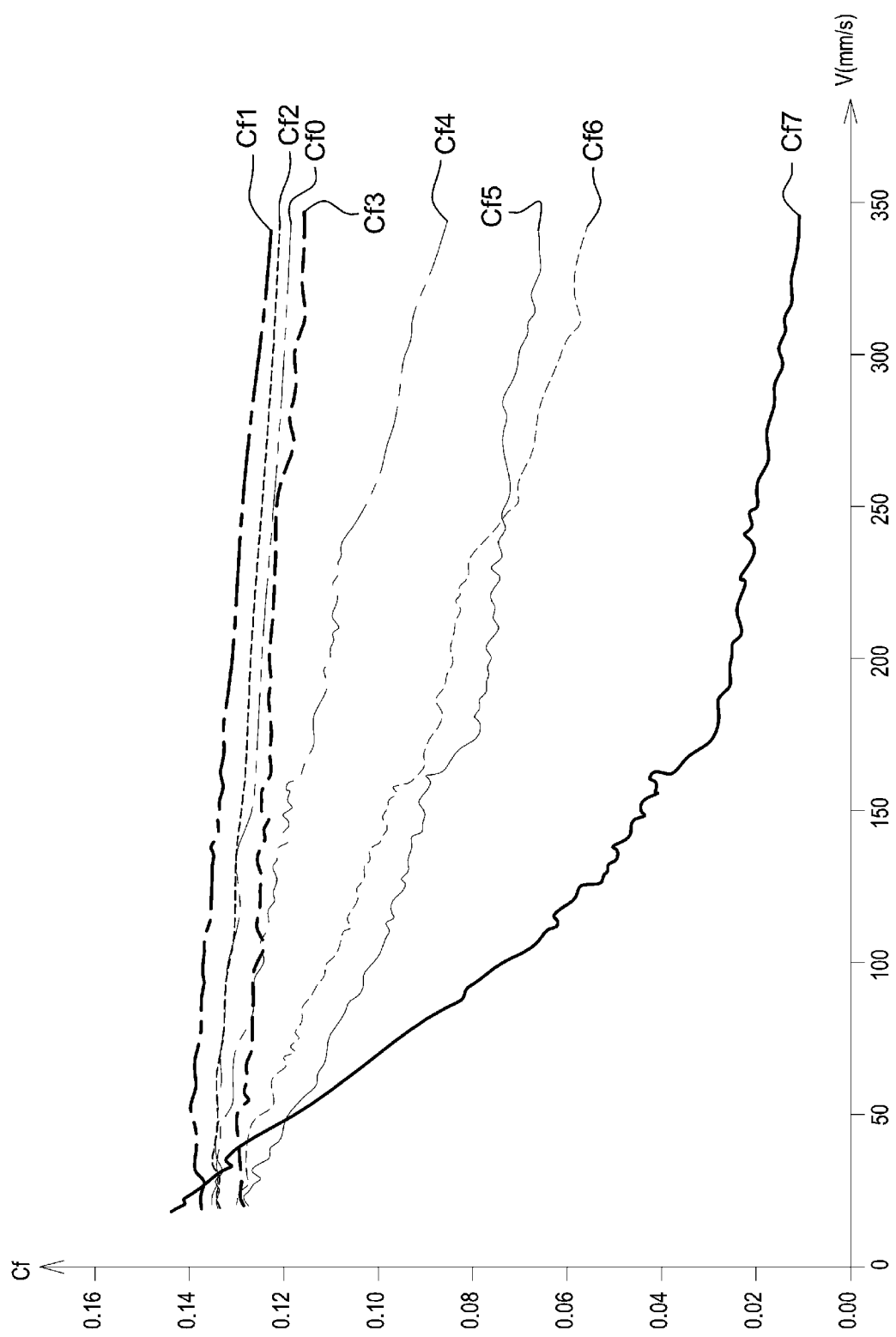

FIG. 7 is a graph illustrating the evolution of the coefficient of friction Cf for different coating materials. Each of the curves shown in this graph corresponds to the curve Cf of FIG. 6, for a given coating material.

The x-axis represents the instantaneous speed V in mm/s, while the y-axis represents the instantaneous coefficient of friction Cf.

The graph of FIG. 7 shows:
- a reference curve cf0 corresponding to the result obtained with the uncoated test pieces 41 and 42 (steel/steel contact);
- a curve Cf1 obtained with the test pieces 41 and 42 coated with chromium nitride (CrN/CrN contact);
- a curve Cf2 obtained with the test pieces 41 and 42 coated with undoped tungsten carbide of reference WC0 (WC/WC contact);
- a curve Cf3 obtained with the test pieces 41 and 42 coated with WC doped with nitrogen with an atomic ratio of reference WC1 of 2% (WC(N)/WC(N) contact);
- a curve Cf4 obtained with the test pieces 41 and 42 coated with tungsten carbide doped with nitrogen with an atomic ratio of reference WC2 of 5% (WC(N)/WC(N) contact);
- a curve Cf5 obtained with the test pieces 41 and 42 coated with tungsten carbide doped with nitrogen with an atomic ratio of reference WC3 of 9% (WC(N)/WC(N) contact);
- a curve Cf6 obtained with the test pieces 41 and 42 coated with tungsten carbide doped with nitrogen with an atomic ratio of reference WC4 of 12% (WC(N)/WC(N) contact);
- a curve CF7 obtained with the test pieces 41 and 42 coated with DLC of the type a-C:H (DLC/DLC contact).

Two types of evolution in the friction coefficient Cf can be distinguished from FIG. 7.

A first group of materials comprises steel, CrN, undoped WC and lightly doped WC(N) (atomic ratio of nitrogen of less than 5%). These materials are characterized by a coefficient of friction Cf higher than 0.12, which decreases gradually when the sliding speed V increases. This friction level is quite typical of the boundary lubrication regime and of the shear of antiwear reaction films that grow on surfaces (tribofilms), formed from the ZnDTP additives contained within the oil 43. The ZnDTP may decompose by reacting on a surface and forming a tribofilm of Zn polyphosphates. Although the friction surfaces are initially polished, the friction in a boundary lubrication regime is induced by the roughness of the tribofilms generated in the form of islands. The observation of planes and cylinders using optical microscopy revealed the presence of these islands, which are of a blue and brown color depending upon the thickness thereof.

A second group of materials comprises the layers of nitrogen-doped WC wherein the nitrogen content reaches or exceeds an atomic ratio of 5%, corresponding to the references WC2, WC3, WC4 and DLC of the type aC:H. These materials are characterized by a coefficient of friction Cf that decreases when the sliding speed V increases. This behavior is typical of the mixed lubrication regime. The reduction in friction in this regime is achieved by the fact that the friction surfaces remain smooth after the test. The rate at which the friction coefficient decreases is a reflection of the roughness of the test pieces after the test. Of all of the materials tested here, DLC is that which induces the greatest reduction in friction. Observing the friction surfaces after the test showed no obvious presence of tribofilms. These films are either absent or of a significantly reduced thickness compared to conventional tribofilms. Less thickness leads to limiting the roughness on initially polished surfaces, insofar as it is the structure of islands and the thickness that produces the roughness.

For the DLC, it is probably the non-metallic nature thereof that leads to the low affinity with respect to ZnDTP. The doping of tungsten carbide with oxygen or nitrogen appears to significantly reduce the affinity with ZnDTP. Unexpectedly, the addition of nitrogen within a deposit of WCCO above an atomic ratio of nitrogen of 5% leads to a lowering in friction in comparison with the undoped or lightly doped layers.

A second characterization test of the coating materials is carried out using flat coated test pieces.

The test consists in heating the test pieces at 350° C. in air for 2 hours. The thickness of the coating layer is measured before and after heating, in order to ensure that the material remains intact. The choice of a temperature of 350° C. makes it possible to accelerate the oxidation kinetics and to classify the materials within a test period of a few hours, instead of several tens of hours.

Table 2 below shows the thickness measurements for each of the coating layers before and after heating. The thicknesses of the deposits are characterized by means of the Calotest.

TABLE 2

Coating thicknesses before and after heating

| Coating material | Initial total thickness (in µm) | Total thickness after 2 hours of heating at 350° C. (in µm) |
|---|---|---|
| CrN | 2.7 | 2.7 |
| WC (ref WC0) | 2.1 | 2.1 |
| Steel | — | — |
| WC(N) (ref WC1) | 2.2 | 2.1 |
| WC(N) (ref WC2) | 2.1 | 2.1 |
| WC(N) (ref WC3) | 2.3 | 2.3 |
| WC(N) (ref WC4) | 2.4 | 2.4 |
| DLC type a-C:H | 3.0 | 0.8 |

Apart from the DLC, all of the coating layers have the same thickness after heating (to within the accuracy of measurement), indicating that the oxidation thereof is insignificant. Furthermore, this is confirmed by the fact that the visual appearance thereof remains unchanged. The temperature and duration are too low for the oxidation to be detectable. Conversely, the entire a-C:H DLC deposit has disappeared due to oxidation. Only the WCC-type sub-layer remains in place, which serves to grip the DLC. Visual examination of the specimen is sufficient to demonstrate the oxidation and disappearance of the DLC, insofar as after oxidation the initially black surface has taken on a metallic luster.

Table 3 below shows the characteristics of the coatings determined by virtue of the various tests above. In particular, it shows the evolution of the friction coefficient between the sliding speeds of 50 mm/s and 300 mm/s, as well as the resistance of the coatings at a moderate temperature of 350° C.

TABLE 3 characteristics of the coatings

| Coating material | Cf at 50 mm/s | Cf at 300 mm/s | Resistance to oxidation at 350° C. | Compliance |
|---|---|---|---|---|
| CrN | 0.140 | 0.126 | Yes | NC |
| WC (ref 0) | 0.135 | 0.123 | Yes | NC |
| Steel | 0.135 | 0.121 | NA | NC |
| WC(N) (ref 1) | 0.130 | 0.118 | Yes | NC |
| WC(N) (ref 2) | 0.132 | 0.095 | Yes | C |
| WC(N) (ref 3) | 0.145 | 0.097 | Yes | C |
| WC(N) (ref 4) | 0.142 | 0.093 | Yes | C |
| DLC type a-C:H | 0.118 | 0.014 | No | NC |

The coatings of CrN, WC undoped with nitrogen (ref WO0), WC(N) slightly doped with nitrogen (ref WC1) are hard layers that are not in accordance with the invention. The friction in a lubricated medium does not lead to a reduction in friction in relation to uncoated polished steel. These materials are able to resist a moderate temperature of 350° C.

The DLC coating, which is widely used in a lubricated medium, is also not in accordance with the invention. Indeed, the reduction in friction in a lubricated medium is spectacular, but exposure to a temperature of 350° C. leads to the destruction of the oxidation coating.

The coverings WC(N) of references WC2, WC3 and WC4 are according to the invention. Unlike the undoped or lightly doped WC, a significant reduction in friction is observed in lubricated mediums. Although this reduction is not as dramatic as for the DLC, these materials have the advantage of not undergoing degradation due to exposure to a temperature of 350° C.

A person skilled in the art will understand that the technical characteristics of the various embodiments and variants mentioned in the above description can, in whole or for some thereof, be combined with one another. Thus, the friction piece 10 may be adapted in terms of cost, functionality and performance.

The invention claimed is:

1. A friction piece having a metal surface and an outer coating layer wherein the outer coating layer is composed of tungsten carbide doped with nitrogen WC(N), wherein the outer coating layer comprises:
   an atomic ratio of carbon of 40% to 43%,
   an atomic ratio of tungsten of 40% to 43%,
   an atomic ratio of nitrogen of 5% to 12%,
   an atomic ratio of cobalt of 7% to 9%, and
   other compounds having a total atomic ratio of 0% to 8%.

2. The friction piece according claim 1, wherein the metal surface is coated with only the outer coating layer.

3. The friction piece according to claim 1, wherein the metal surface is coated with at least one sub-layer formed beneath the outer coating layer.

4. The friction piece according to claim 3, the sub-layer is composed of chromium or chromium nitride.

5. A mechanical system, comprising:
- a first friction piece according to claim 1,
- a second friction piece arranged in lubricated contact with the first friction piece and
- a lubricant arranged at a lubricated contact interface between the first friction piece and the second friction piece.

6. The mechanical system according to claim 5, wherein the second friction piece comprises a metal surface arranged directly in lubricated contact with the first friction piece.

7. The mechanical system according to claim 5, wherein the second friction piece comprises a metal surface and an outer coating layer deposited upon the metal surface, the outer coating layer of the second friction piece being composed of nitrogen-doped tungsten carbide WC(N) with an atomic ratio of nitrogen between 5% and 12%.

8. The mechanical system according to claim 7, wherein the outer coating layer of the first friction piece and the outer coating layer of the second friction piece have the same composition.

9. A method for implementing a friction piece according to claim 1, comprising:
- arranging a second friction piece in lubricated contact with the friction piece;
- arranging a lubricant at a lubricated contact interface between the friction piece and the second friction piece; and
- actuating the friction piece and the second friction piece, in such a way that the lubricated contact interface between the friction piece and the second friction piece reaches a temperature higher than 200° C.

* * * * *